（12）United States Patent
Ha et al.

(10) Patent No.: US 10,269,626 B2
(45) Date of Patent: Apr. 23, 2019

(54) STAIR STEP FORMATION USING AT LEAST TWO MASKS

(71) Applicant: Micron Technology, Inc., Boise, ID (US)

(72) Inventors: Chang Wan Ha, San Ramon, CA (US); Graham R. Wolstenholme, Boise, ID (US); Deepak Thimmegowda, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/867,017

(22) Filed: Jan. 10, 2018

(65) Prior Publication Data

US 2018/0130700 A1 May 10, 2018

Related U.S. Application Data

(60) Continuation of application No. 15/359,218, filed on Nov. 22, 2016, now Pat. No. 9,870,941, which is a
(Continued)

(51) Int. Cl.
*H01L 21/768* (2006.01)
*H01L 27/105* (2006.01)
(Continued)

(52) U.S. Cl.
CPC .... *H01L 21/76816* (2013.01); *H01L 21/0337* (2013.01); *H01L 21/32139* (2013.01);
(Continued)

(58) Field of Classification Search
CPC ......... H01L 21/32139; H01L 27/11548; H01L 27/11556; H01L 27/11575;
(Continued)

(56) References Cited

U.S. PATENT DOCUMENTS 7,669,172 B2 2/2010 Ito et al.
7,847,334 B2 12/2010 Katsumata et al.
(Continued)

FOREIGN PATENT DOCUMENTS

CN 102088019 6/2011
CN 102110690 6/2011
(Continued)

OTHER PUBLICATIONS

Tanaka, et al., "Bit Cost Scalable Technology with punch and plug process for Ultra High Density Flash Memory," Jun. 2007, pp. 14-15, TOSHIBA Corporation.
(Continued)

*Primary Examiner* — Luan C Thai
(74) *Attorney, Agent, or Firm* — TraskBritt

(57) ABSTRACT

Apparatuses and methods for stair step formation using at least two masks, such as in a memory device, are provided. One example method can include forming a first mask over a conductive material to define a first exposed area, and forming a second mask over a portion of the first exposed area to define a second exposed area, the second exposed area is less than the first exposed area. Conductive material is removed from the second exposed area. An initial first dimension of the second mask is less than a first dimension of the first exposed area and an initial second dimension of the second mask is at least a second dimension of the first exposed area plus a distance equal to a difference between the initial first dimension of the second mask and a final first dimension of the second mask after a stair step structure is formed.

6 Claims, 15 Drawing Sheets

Related U.S. Application Data continuation of application No. 14/797,390, filed on Jul. 13, 2015, now Pat. No. 9,508,591, which is a continuation of application No. 14/085,361, filed on Nov. 20, 2013, now Pat. No. 9,082,772, which is a division of application No. 13/543,154, filed on Jul. 6, 2012, now Pat. No. 8,609,536.

(51) Int. Cl.

| | | |
|---|---|---|
| *H01L 21/033* | (2006.01) | |
| *H01L 21/3213* | (2006.01) | |
| *H01L 27/11519* | (2017.01) | |
| *H01L 27/11556* | (2017.01) | |
| *H01L 27/11565* | (2017.01) | |
| *H01L 27/11582* | (2017.01) | |
| *H01L 23/535* | (2006.01) | |
| *H01L 27/11548* | (2017.01) | |
| *H01L 27/11575* | (2017.01) | |

(52) U.S. Cl.
CPC .. *H01L 21/76822* (2013.01); *H01L 21/76865* (2013.01); *H01L 23/535* (2013.01); *H01L 27/1052* (2013.01); *H01L 27/11519* (2013.01); *H01L 27/11548* (2013.01); *H01L 27/11556* (2013.01); *H01L 27/11565* (2013.01); *H01L 27/11575* (2013.01); *H01L 27/11582* (2013.01); *H01L 2924/0002* (2013.01)

(58) Field of Classification Search
CPC ........... H01L 27/11582; H01L 21/0337; H01L 21/76816; H01L 21/76822; H01L 21/76865; H01L 23/535; H01L 27/1052; H01L 27/11519; H01L 27/11565
USPC ......................................................... 438/739
See application file for complete search history.

(56) References Cited

U.S. PATENT DOCUMENTS

| | | | | |
|---|---|---|---|---|
| 7,910,432 | B2* | 3/2011 | Tanaka | H01L 27/11582 257/324 |
| 7,977,733 | B2* | 7/2011 | Shiino | H01L 27/11582 257/324 |
| 8,008,710 | B2 | 8/2011 | Fukuzumi et al. | |
| 8,089,120 | B2 | 1/2012 | Tanaka et al. | |
| 8,304,348 | B2* | 11/2012 | Hashimoto | H01L 27/11582 438/618 |
| 8,329,051 | B2 | 12/2012 | Fu et al. | |
| 8,331,149 | B2 | 12/2012 | Choi et al. | |
| 8,334,551 | B2* | 12/2012 | Itagaki | G11C 5/02 257/216 |
| 8,476,713 | B2 | 7/2013 | Lee et al. | |
| 8,680,604 | B2 | 3/2014 | Higashi et al. | |
| 9,230,904 | B2 | 1/2016 | Eun et al. | |
| 2004/0209411 | A1 | 10/2004 | Fisher et al. | |
| 2009/0310415 | A1 | 12/2009 | Jin et al. | |
| 2010/0207186 | A1 | 8/2010 | Higashi et al. | |
| 2011/0084397 | A1 | 4/2011 | Lung | |
| 2011/0115010 | A1 | 5/2011 | Shim et al. | |
| 2011/0244666 | A1 | 10/2011 | Kim et al. | |
| 2011/0266604 | A1 | 11/2011 | Kim et al. | |
| 2011/0286283 | A1 | 11/2011 | Lung et al. | |
| 2012/0119287 | A1 | 5/2012 | Park et al. | |
| 2012/0149201 | A1 | 6/2012 | Fu et al. | |
| 2012/0306089 | A1 | 12/2012 | Freeman et al. | |

FOREIGN PATENT DOCUMENTS

| | | |
|---|---|---|
| JP | 2004533110 | 10/2002 |
| JP | 2010-045149 | 2/2010 |
| JP | 2010192589 | 9/2010 |
| KR | 10-2009-0128779 | 12/2009 |
| KR | 10-2010-0039919 | 4/2010 |
| KR | 10-2011-0111809 | 10/2011 |
| KR | 1020110121332 | 11/2011 |
| WO | 2002078095 | 10/2002 |

OTHER PUBLICATIONS

International Search Report for related PCT Application No. US-2013-049360, dated Oct. 17, 2013, 11 pages.
Notice of Rejection for related Japan Patent Application No. 2015-520689, dated Dec. 22, 2015, 12 pages.
Notice of Rejection for related Korea Patent Application No. 10-2015-7002549, dated Jan. 25, 2016, 19 pages.
Partial Supplementary EP Search Report for related EP Patent Application No. 13813187.5, dated Feb. 1, 2016, 6 pages.
Supplementary European Search Report for related EP Patent Application No. 13813187.5, dated May 18, 2016, 10 pages.
Notice of Rejection for related Korea Patent Application No. 10-2015-7002549, dated May 25, 2016, 19 pages.
Notice of Rejection for related Japan Patent Application No. 2015-520689, dated Jul. 12, 2016, 15 pages.
Notice of Rejection for related Korea Patent Application No. 10-2015-7002549, dated Aug. 18, 2016, 6 pages.
Office Action for related China Patent Application No. 201380041275.3, dated Sep. 29, 2016, 17 pages.
Notice of Rejection for related Korea Patent Application No. 10-2015-7002549, dated Nov. 21, 2016, 5 pages.
Communication Pursuant to Article 94(3) EPC for related EP Application No. 13813187.5, dated Dec. 15, 2016, 4 pages.
Office Action for related China Patent Application No. 201380041275.3, dated May 27, 2017, 15 pages.
Office Action for related China Patent Application No. 201380041275.3, dated Nov. 1, 2017, 6 pages.
Notice of Reasons for Rejection from Korean Application No. 10-2016-7035867, dated Sep. 13, 2018, 11 pages.
Chinese Notice of Re-Examination from Chinese Application No. 201380041275.3, dated Aug. 23, 2018, 20 pages.
Chinese Office Action for Chinese Application No. 201380041275.3, dated Sep. 29, 2016, ** pages with English translation.
Chinese Decision of Rejection for Chinese Application No. 201380041275.3, dated Jan. 24, 2018, 13 pages with English translation.
European Examination Report from European Application No. 13813187.5, dated Dec. 15, 2016, 4 pages.
European Partial Search Report from European Application No. 13813187.5, dated Feb. 1, 2016, 5 pages.
European Supplementary Search Report from European Application No. 13813187.5, dated May 18, 2016, 9 pages.
Japanese Office Action from Japanese Application No. 2015-520689, dated Dec. 18, 2015, 12 pages with English translation.
Japanese Office Action from Japanese Application No. 2015-520689, dated Jul. 6, 2016, 14 pages with English translation.
Notice of Reasons for Refusal from Korean Application No. 10-2015-7002549, dated May 25, 2016, 19 pages with English translation.
Notice of Final Rejection from Korean Application No. 10-2015-7002549, dated Nov. 21, 2016, 4 pages with English translation.
Chinese Office Action for Chinese Application No. 201380041275.3, dated Sep. 29, 2016, 19 pages with English translation.
Chinese Office Action for Chinese Application No. 201380041275.3, dated May 27, 2017, 15 pages with English translation.
Chinese Office Action for Chinese Application No. 201380041275.3, dated Nov. 1, 2017, 6 pages with English translation.
Korean Trial Decision for Korean Application No. 10-2015-7002549, dated Nov. 15, 2018, 16 pages.
European Examination Report received for European Patent Application No. 13813187.5, dated Oct. 10, 2018, 7 pages.
Chinese Second Notice of Re-Examination from Chinese Application No. 201380041275.3, dated Feb. 1, 2019, 13 pages.

* cited by examiner

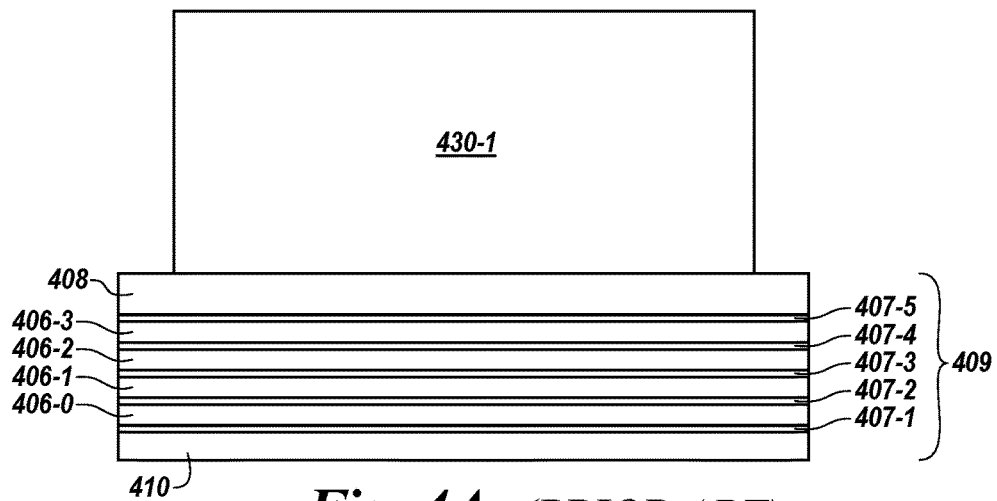
Fig. 4A *(PRIOR ART)*
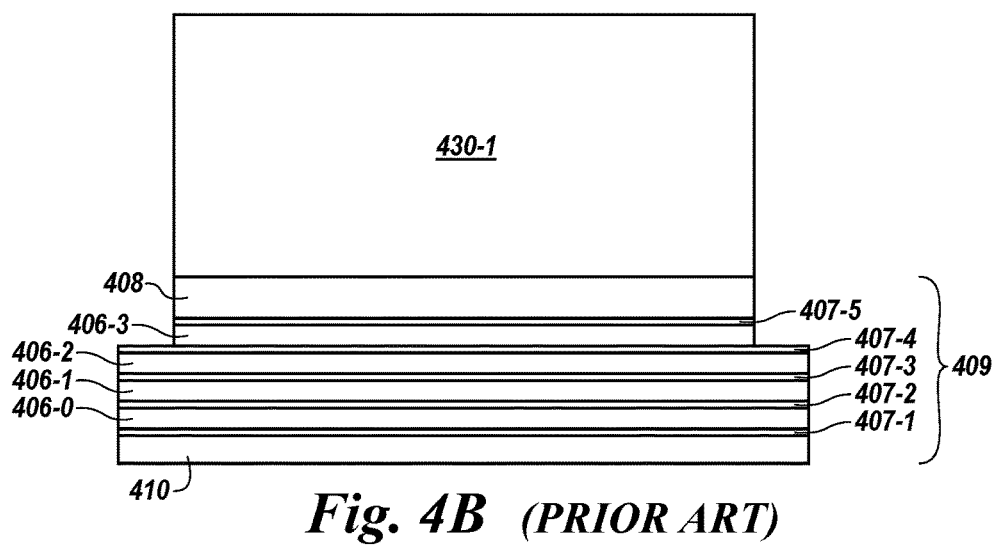
Fig. 4B *(PRIOR ART)*
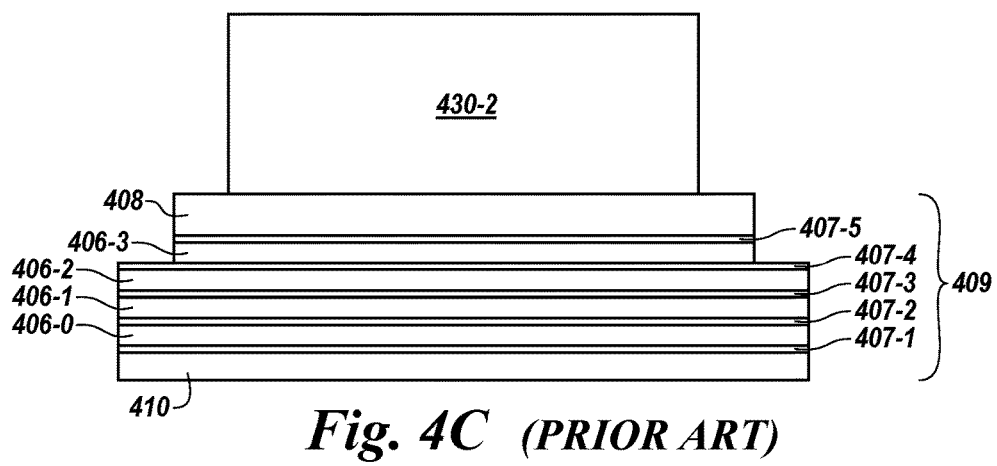
Fig. 4C *(PRIOR ART)*

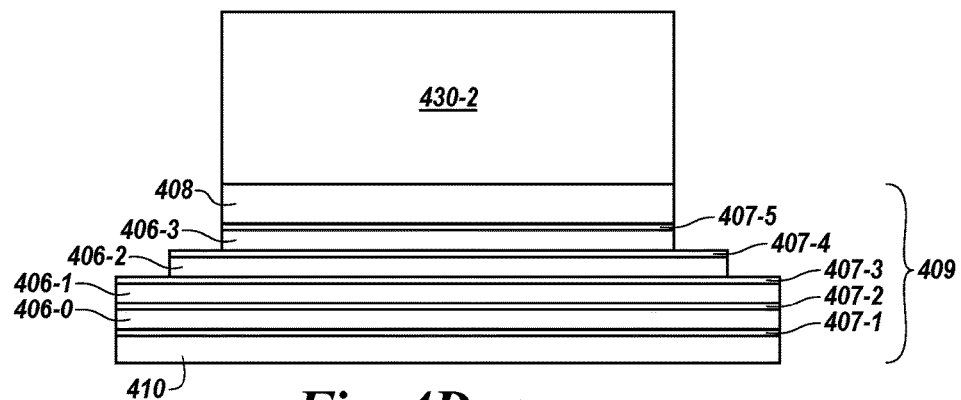
Fig. 4D *(PRIOR ART)*
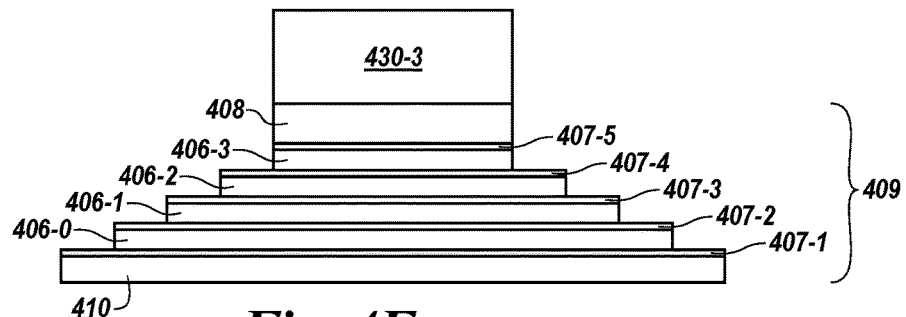
Fig. 4E *(PRIOR ART)*
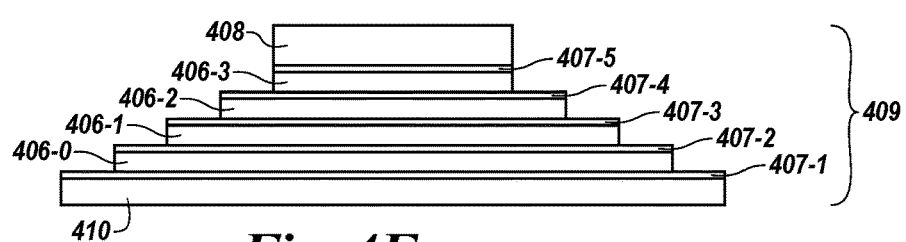
Fig. 4F *(PRIOR ART)*

STAIR STEP FORMATION USING AT LEAST TWO MASKS

CROSS-REFERENCE TO RELATED APPLICATIONS

This application is a continuation of U.S. patent application Ser. No. 15/359,218, filed Nov. 22, 2016, now U.S. Pat. No. 9,870,941, issued Jan. 16, 2018, which is a continuation of U.S. patent application Ser. No. 14/797,390, filed Jul. 13, 2015, now U.S. Pat. No. 9,508,591, issued Nov. 29, 2016, which is a continuation of U.S. patent application Ser. No. 14/085,361, filed Nov. 20, 2013, now U.S. Pat. No. 9,082,772, issued Jul. 14, 2015, which is a divisional of U.S. patent application Ser. No. 13/543,154, filed Jul. 6, 2012, now U.S. Pat. No. 8,609,536, issued Dec. 17, 2013, the disclosure of each of which is hereby incorporated herein in its entirety by this reference.

TECHNICAL FIELD

The present disclosure relates generally to semiconductor memory apparatuses and methods of forming and, more particularly, to apparatuses and methods for stair step formation using at least two masks.

BACKGROUND

Memory devices are typically provided as internal, semiconductor, integrated circuits in computers or other electronic devices. There are many different types of memory, including random-access memory (RAM), read-only memory (ROM), dynamic random access memory (DRAM), synchronous dynamic random access memory (SDRAM), resistive memory, e.g., RRAM, and Flash memory, among others.

Memory devices are utilized as volatile and non-volatile data storage for a wide range of electronic applications. Flash memory typically uses a one-transistor memory cell that allows for high memory densities, high reliability, and low power consumption. Non-volatile memory may be used in, for example, personal computers, portable memory sticks, solid-state drives (SSDs), digital cameras, cellular telephones, portable music players such as MP3 players, movie players, and other electronic devices.

Memory devices can comprise memory arrays of memory cells, which can be arranged in various two- or three-dimensional configurations. Circuitry coupled to a memory array can be arranged in a substantially planar configuration, for instance. Interconnections are used to couple memory cells and associated circuitry.

BRIEF DESCRIPTION OF THE DRAWINGS

FIGS. 4A-4F are prior art block diagrams illustrating a side view of stair step formation using a shrinking photo resist.

DETAILED DESCRIPTION

Figure 1:
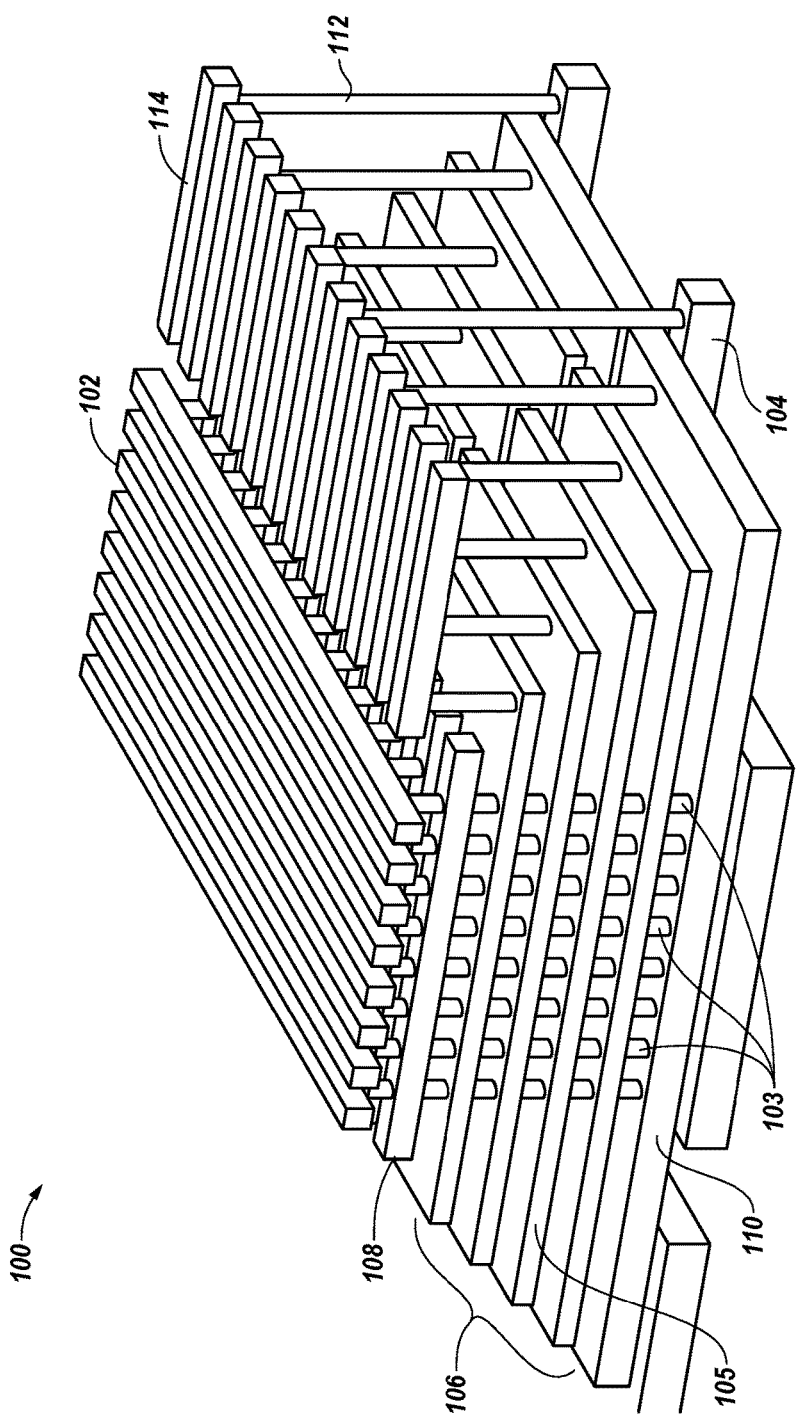
FIG. 1 is a prior art perspective view of a portion of a three-dimensional (3D) memory device.

Apparatuses and methods for stair step formation using at least two masks, such as in a memory device, are provided. One example method can include forming a first mask over a conductive material to define a first exposed area, and forming a second mask over a portion of the first exposed area to define a second exposed area, the second exposed area being less than the first exposed area. Conductive material is removed from the second exposed area. An initial length of the second mask is less than a length of the first exposed area and an initial width of the second mask is at least a width of the first exposed area plus a distance equal to a difference between the initial length of the second mask and a final length of the second mask after a stair step structure is formed.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

The terms "first," "second," "third," and "fourth" may be used herein, and/or in the claims, merely for convenience in differentiating the nomenclature of various features from one another. The use of such terms does not necessarily imply that the materials are of different composition, but sometimes are used to distinguish between materials formed at different elevations, at different times, or in different manners, even if of the same composition. The use of such terms does not intend to convey a particular ordering of the features including, but not limited to, an order of forming.

FIG. 1 is a prior art perspective view of a portion of a three-dimensional (3D) memory device 100. The memory device 100 can comprise, for example, a NAND flash memory array. Memory device 100 includes a number of vertical strings of series-coupled memory cells 103 oriented orthogonal to a number of conductive lines, such as access lines 105 and/or data lines 102. As used herein, A "coupled to" B refers to A and B being operatively coupled together, such as where A and B are electrically connected with each other, such as through a direct ohmic connection or through an indirect connection, e.g., via C. Insulating materials between various conductive lines are omitted from FIG. 1 for clarity. Conductive materials can be formed of polysilicon, for example, or other doped or undoped materials. Insulating materials can be formed of oxide, for example, or other dielectric materials.

A first select gate 108, such as a drain select gate (SGD), can be arranged at a first end of a number of the vertical strings of series-coupled memory cells 103, and a second select gate 110, such as a source select gate (SGS), can be arranged at a second end, e.g., opposite end, of the vertical strings of series-coupled memory cells 103.

A plurality of data lines 102 can be oriented in a first plane, and further oriented in a first direction in the first plane, the vertical strings of series-coupled memory cells 103 being oriented orthogonal to the first plane. A plurality of access lines 105 can be oriented in a second plane, and further oriented in a second direction in the second plane. As shown in FIG. 1, the access lines 105 can be formed in a planar configuration. The second plane can be substantially parallel to the first plane. The second direction can be perpendicular to the first direction, for example. The data lines 102 can be shared by a number of vertical strings of series-coupled memory cells 103 in the first direction, and the access lines 105 can be shared by a number of vertical strings of series-coupled memory cells 103 in the second direction.

One or more source lines 104 can be oriented in a third plane, the third plane being substantially parallel to the first and second planes. The source lines 104 can be further oriented in the second direction, e.g., the same direction as the access lines 105 as shown in FIG. 1, or a different direction. The select gates 108 and 110 can operate to select a particular vertical string of series-coupled memory cells 103 between a data line 102 and a source line 104. As such, the vertical strings of series-coupled memory cells 103 can be located at the intersections of the data lines 102 and source line 104.

The access lines 105 are coupled to (and in some cases from) control gates of memory cells at a particular level and can be used to select a particular one of the series-coupled memory cells within a vertical string. In this manner, a particular memory cell can be selected and electrically coupled to a data line 102 via operation of the first select gate 108, second select gate 110, and an access line 105. The access lines 105 can be configured to select a memory cell at a particular location within one or more of the vertical strings of series-coupled memory cells 103.

As can be observed in FIG. 1, the planar access lines 105 can be configured to have multiple 3D stair step structures 106 to facilitate vertically-oriented coupling thereto, such as by vertical conductors 112. That is, respective planar access lines 105 can be formed as respective stair steps of the stair step structure 106. A stair step structure 106, as used herein, means a 3D structure having a plurality of stair steps at different elevations extending to different distances in a lateral direction, such as is generally associated with a set of stair steps. According to one embodiment of the present disclosure, the steps of lower elevations can extend laterally beyond the lateral distance that the step at an immediately higher elevation extends, as shown in FIG. 1. That is, lower steps extend further in a lateral direction than step(s) above. FIG. 1 shows steps on two ends of the planar access lines 105, but not on the nearest edge. According to a previous approach, steps are formed on all edges and subsequently trimmed away from those edges at which steps were not wanted thereby wasting the area where steps were formed and subsequently removed. Such wasted area can increase the effective footprint of the memory device 100.

For example, FIG. 1 shows a stack of materials comprising at least the first select gate 108, access lines 105, second select gate 110, having three of four edges formed to have a stair step configuration. Although FIG. 1 shows a stack of materials having edges formed into a stair step configuration, it is not prior art to only form a portion of an edge of the stack of materials into a stair step configuration, as discussed later. Embodiments of the present disclosure can include a stack of materials having one or more edges having a stair step configuration. Embodiments of the present disclosure can include only a portion, e.g., less than all, of an edge of a stack formed into a stair step configuration. For example, embodiments of the present disclosure can include that a first portion of one edge of a stack of materials can be formed to have a stair step configuration and a second portion of the one edge can be formed so as not to have a stair step configuration, as will be detailed further herein.

A lower step can extend laterally a sufficient distance beyond a next higher step so that a vertical coupling can be made to the portion of the lower step extending laterally past the next higher step. In this manner, a vertical conductor 112 can be coupled to the lower step, such as to an access line 105, select gate 108 or 110, or source line 104, which each can correspond to a step in the stair step structure 106.

The memory array 100 can be coupled to various circuitry associated with operating the memory array 100. Such circuitry can include string driver circuitry, for instance. As an example, horizontal conductive lines 114 can be routed from the memory array 100, for example, to a string driver. Steps of the stair step structure 106 can be coupled to the conductive lines 114, e.g., via the vertical conductors 112. In this manner, an electrical coupling can be made between the vertical stack of access lines 105, select gates 108/110, and/or source lines 104, and the string driver, e.g., via the planar horizontal conductive lines 114.

The strings of NAND memory cells can be arranged with select gate transistors coupled at each end, e.g., source, drain. Each string can include a number of memory cells coupled in series, drain-to-source. Vertical strings of NAND memory cells can be arranged such that the string of series-coupled memory cells are linearly arranged in a vertical orientation, or can be arranged in non-linear configuration such as in a "U" shape, with portions of the "U" shape being oriented vertically, for example. That is, the string of series-coupled memory cells can be arranged in a dimension orthogonal to the planes encompassing the access lines, e.g., word lines, and data lines, e.g., bit lines.

Figure 2:
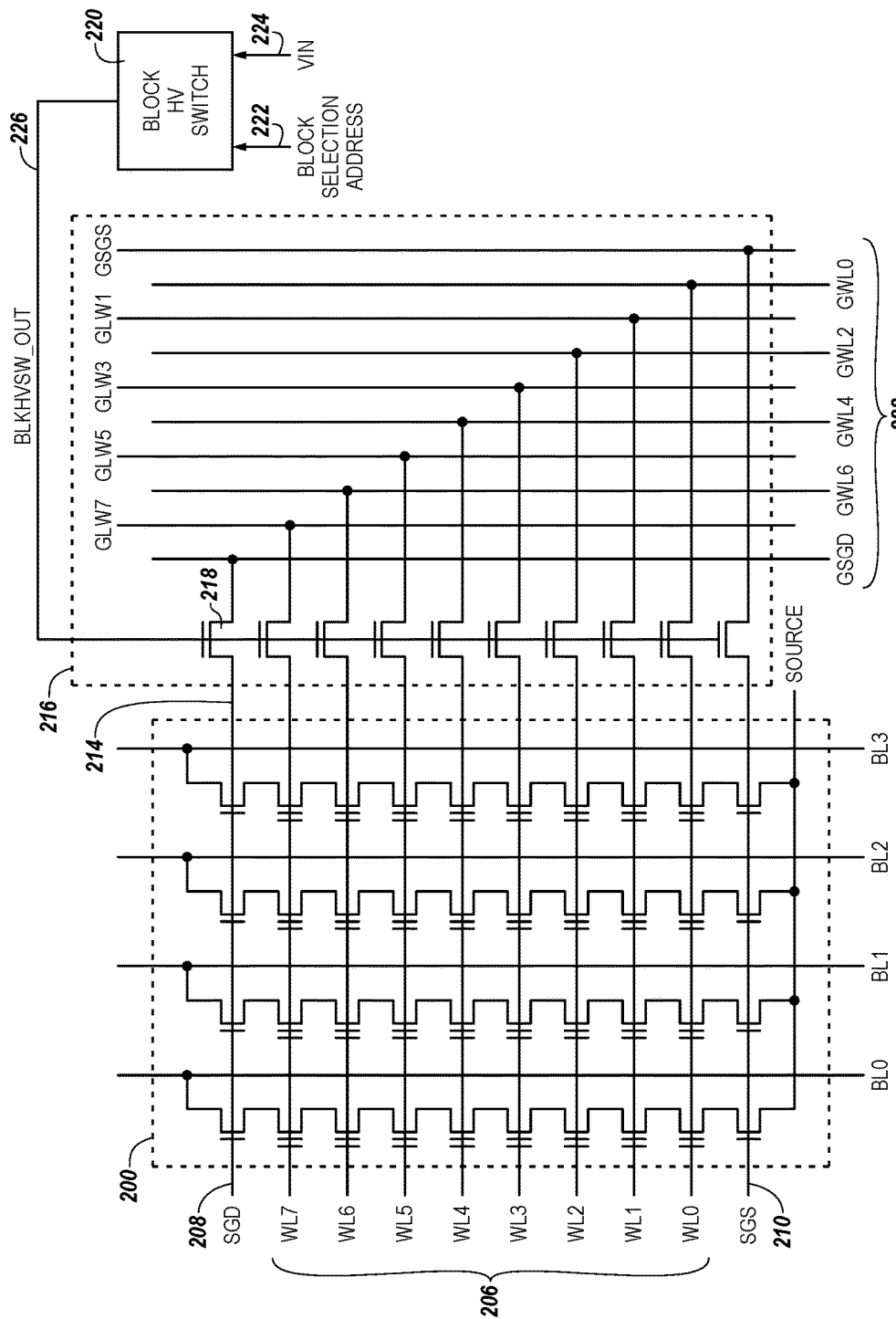
FIG. 2 is a prior art schematic diagram illustrating connections between a memory array and a string driver.

FIG. 2 is a prior art schematic diagram illustrating coupling between a memory array 200 and a string driver 216. String driver 216 can be used to control selection of particular strings of memory cells and/or particular memory cells, such as by application of a voltage signal of particular select gates and/or particular memory cells within the strings of memory cells, e.g., by appropriate assertion of access lines 206. FIG. 2 shows the access lines 206, select gate 208 (SGD), and select gate 210 (SGS) of a memory array 200 being coupled to a string driver 216 via a number of conductive lines 214. The string driver 216 can be formed using CMOS devices, for example. The memory array 200 further includes the data lines 202 arranged as shown and coupled to the strings of memory cells.

The access lines 206, select gate 208 (SGD), and select gate 210 (SGS) of a memory array 200 can be coupled to respective global access lines 228 through selection transistors 218. The selection transistors 218 can be field effect transistors (FETs), for example. The selection transistors 218 can be controlled via a block high voltage switch output (BLKHVSW_OUT) signal line 226, which is coupled between an output of a block high voltage switch 220 and, for example, the gate of each of the selection transistors 218. The block high voltage switch 220 receives as inputs, for example, a block selection address 222 and an input voltage 224 to produce the BLKHVSW_OUT signal on the block high voltage switch output signal line 226 when appropriate to couple the access lines 206, select gate 208 (SGD), and select gate 210 (SGS) of memory array 200 to the global access lines 228.

Figure 3:
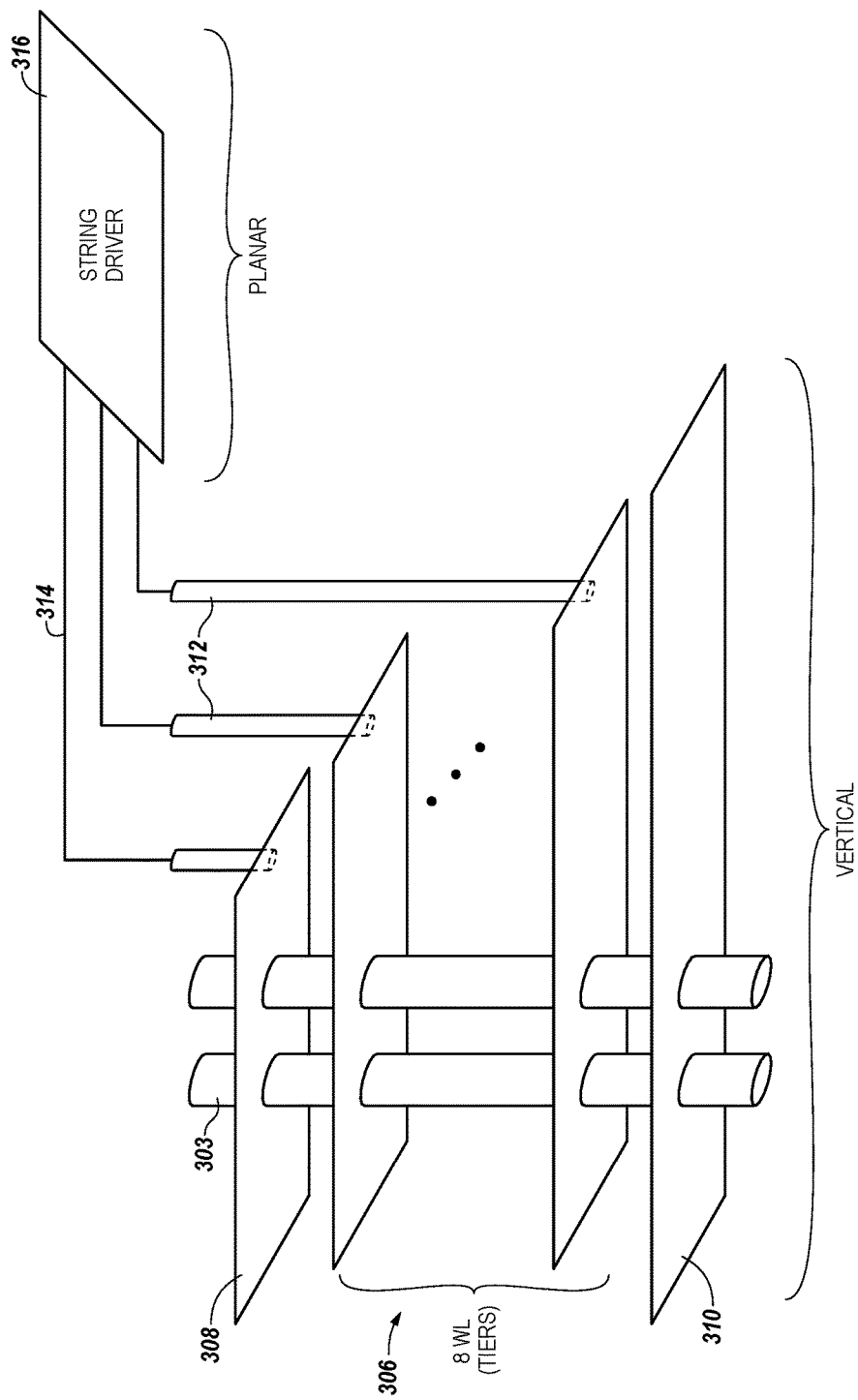
FIG. 3 is a prior art isolated perspective block diagram illustrating connections between a 3D memory array and a planar string driver.

In a sensing operation, such as a read or a program verify operation, global access line driver 216 provides positive voltage signals to global access lines 228, e.g., global word lines, to select a particular local access line coupled to memory cells being sensed. Unselected access lines, such as access lines not coupled to memory cells being read or verified, can be provided with a pass voltage (Vpass), while the selected access line can be provided with a read voltage. Other techniques are possible for reading and/or programming memory cells. According to various embodiments, the memory array 200 can be implemented as a 3D memory array with the strings being oriented vertically and the string driver 216, including the selection transistors 218, can be implemented as a substantially planar device, such as is shown in FIG. 3. A stair step structure comprising the conductive lines 214 can be used to electrically couple the vertical 3D array and horizontal planar structures, e.g., string driver 216.

FIG. 3 is a prior art isolated perspective block diagram illustrating coupling between a 3D memory array and a planar string driver. FIG. 3 shows, in isolation, the use of a stair step structure to couple a vertical stack structure, e.g., a 3D memory array and a substantially planar structure, e.g., planar string driver 316. The vertical stack structure is comprised of a number of steps of conductive materials including a select gate 308, e.g., SGD, a plurality of access lines 306, e.g., 8 steps of word lines, and a select gate 310, e.g., SGS, of a memory array. Vertical strings of series-coupled memory cells 303 are arranged orthogonally to the steps of the vertical stack structure (only two of many vertical strings are shown in FIG. 3 for simplicity).

Vertical conductors 312 are shown coupled to the various steps where a lower step extends beyond the step above the respective lower step. The vertical conductors 312 are coupled to horizontal conductive lines 314, which, in turn, are coupled to the substantially planar string driver 316, such as in the manner shown schematically in FIG. 2. The conductors, transistors, and/or other elements of the string driver 316 are three-dimensional, and thus not strictly planar, in that they have a finite length, width, and height. However, the string driver is referred to herein as being substantially planar in that the dimensions in two directions are significantly greater than the dimension in the third direction. For example, planar can refer to a structure having non-stacked elements, whereas 3D can refer to a structure that has stacked elements, e.g., a plurality of elements in each of three dimensions.

FIGS. 4A-4F are prior art block diagrams illustrating a side view of stair step formation using a shrinking photo resist. FIG. 4A shows a stack 409 of alternating conductive materials and insulating materials 407-1, 407-2, . . . 407-5. The conductive materials can include a select gate 408 material, e.g., a drain select gate material, formed over a plurality of access line 406-0, 406-1, 406-2, and 406-3 materials, formed over a select gate 410 material, e.g., a source select gate material. Although only materials of four access lines 406-0, 406-1, 406-2, and 406-3 are shown in stack 409, embodiments of the present disclosure are not limited to a stack comprising a particular quantity, order, or composition of materials, and may include more or fewer access line materials, select gate materials, and/or other materials. Furthermore, the stack 409 need not be formed by alternating single conductive and insulating materials, and can include, for example, several conductive materials separated by two different insulating materials formed adjacent one another (which can be considered as conductive and insulating materials), as well as other combinations and configurations of materials.

A photo resist 430-1 is formed over the stack 409. As shown in FIG. 4A, the photo resist 430-1 can be formed such that it does not extend laterally to edges of the stack 409. That is, the photo resist 430-1 can be formed to be smaller in each dimension than the stack 409, so as to leave a lateral portion of the stack 409 exposed in each direction. Although the side view of cut through the stack of materials of FIG. 4A shows the photo resist not extending to two opposite edges of the stack 409, e.g., right and left, the prior art photo resist 430-1 is formed so as to not extend to the edges in the direction of the view, e.g., front and back edges, of stack 409. The photo resist 430-1 is formed so as to leave the width of one stair step of stack 409 exposed at each edge of the stack 409.

FIG. 4B shows the configuration of stack 409 after a first material removal process, e.g., an etch of polysilicon materials and oxide materials such as a reactive ion etch. Portions of stack 409 not protected by photo resist 430-1 are removed. The material removal process is controlled so as to remove material of the stack 409 to a predefined depth, such as by duration and/or composition of the etch, or by other technique. For example, FIG. 4B shows that the first material removal process removed material from stack 409 to a depth of insulating material 407-4, including portions of select gate 408 material, insulating material 407-5, and access line 406-3 material not covered by photo resist 430-1. The first removal process can be stopped at the depth of the access line 406-3 material, e.g., removing only the select gate 408 material and insulating material 407-5, so as to form a first stair step that does not include the access line 406-3 material.

In this manner a stair step is formed of the select gate 408 material, insulating material 407-5, and access line 406-3 material, with respect to the rest of the materials of stack 409. FIG. 4B shows the stair step being formed at two opposite edges of stack 409 simultaneously. Likewise, steps are formed at the front and back edges.

FIG. 4C shows a photo resist 430-2 being re-sized in a lateral dimension from that of photo resist 430-1 shown in FIGS. 4A and 4B so as to expose another portion of the top material of the stack 409, e.g., select gate 408 material. The photo resist is also resized to be smaller in the direction of the view of FIG. 4C, e.g., front-to-back. Re-sizing of the photo resist 430-2 can be accomplished by various techniques. For example, the photo resist 430-1 shown in FIGS. 4A and 4B can be trimmed in place, or removed completely such as by chemical-mechanical polishing (CMP) and a new photo resist 430-2 of smaller dimensions deposited over select gate 408 material as shown in FIG. 4C. The photo resist 430-1 can be trimmed in place, for example, during polysilicon and oxide dry etching used to create respective stair steps, e.g., such that an intervening structure such as that shown in FIG. 4B would not exist.

FIG. 4D shows the configuration of stack 409 after a subsequent material removal process, e.g., a second etch. Some depth of material of stack 409 not protected by photo resist 430-2 is removed. The material removal process is controlled so as to remove material of the stack 409 to a predefined depth. For example, FIG. 4D shows that the second material removal process is controlled to remove material from stack 409 including another portion of exposed select gate 408 material, insulating material 407-5, and access line 406-3 material not covered by photo resist 430-2. The second material removal process also removes insulating material 407-4 (exposed by the first material removal process) and access line 406-2 material, which is exposed after insulating material 407-4 is removed during the second material removal process. FIG. 4D shows a stair step structure with the two (right and left) steps resulting from the second removal process. Similarly, additional steps are simultaneously formed on front and back edges of the stack according to the previous approach. Note that the nomenclature used herein is based on a step is a "notch" cut into the stack of materials, the notch being a corner formed by a horizontal surface and a vertical surface. Accordingly, FIG. 4A shows zero steps (instead of one), FIGS. 4B and 4C show one step (instead of two), and FIG. 4D shows two steps (instead of three).

The material removal processes can be further repeated, each subsequent removal process utilizing a photo resist mask that is smaller by a stair step width associated with each respective location of stair step formation, e.g., each of left, right, front, and back edges. A stair step width can be 10 micrometers, for example.

FIG. 4E shows the configuration of stack 409 after four material removal processes, e.g., four etches, where photo resist 430-3 is reduced by the width of several steps on each edge with respect to photo resist 430-2. FIG. 4F shows the configuration of stack 409 after the four material removal processes and after the photo resist 430-3 is removed, e.g., by CMP, leaving a final stair step structure. Although each stair step is shown with a respective insulating material atop the stair step (select gate 408 material is not counted as a step), vertical coupling can be made to each respective underlying conductive material, e.g., select gate material and/or access line material, using further etch techniques to form a plug through overlying insulating layers.

Figure 5A:
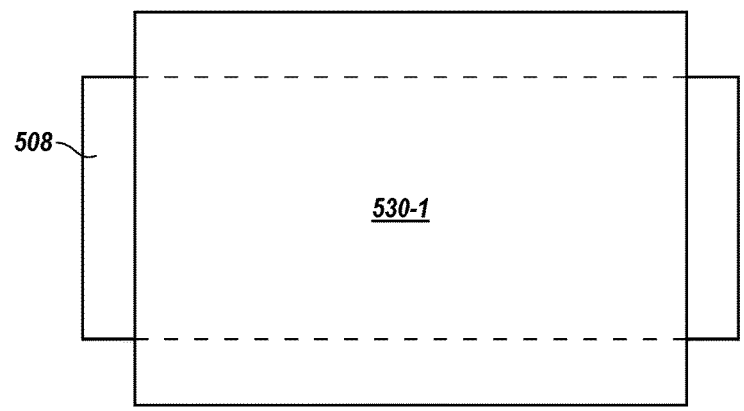
FIGS. 5A-5F are block diagrams illustrating a top view of stair step formation using a shrinking photo resist in accordance with one or more embodiments of the present disclosure.
Figure 5B:
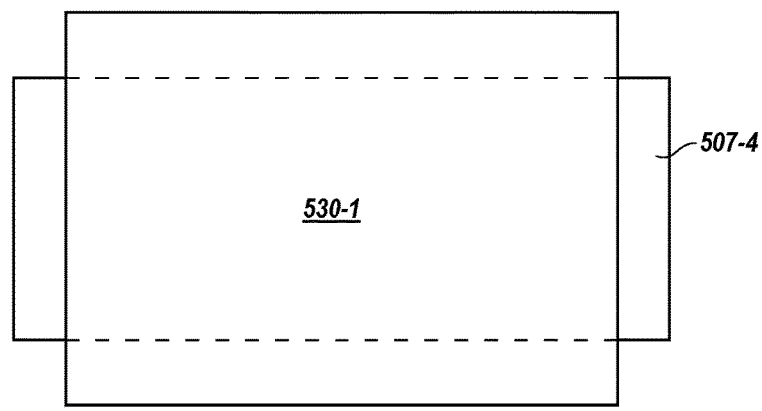

FIGS. 5A-5F are block diagrams illustrating a top view of stair step formation using a shrinking photo resist in accordance with one or more embodiments of the present disclosure. FIGS. 5A-5F are top views that correspond to the side views shown in FIGS. 4A-4F. That is, FIG. 5A is a top view that corresponds to FIG. 4A, FIG. 5B is a top view that corresponds to FIG. 4B, etc. As previously detailed, reference numbers also correspond between FIGS. 5A-5F and 4A-4F, with the first digit reflecting the appropriate figure number.

FIG. 5A shows a photo resist 530-1 formed over a stack of alternating conductive materials and insulating materials, e.g., stack 409 shown in profile in FIG. 4A. More particularly, photo resist 530-1 is formed over the select gate 508 material, which is the top material of the stack. As shown, the photo resist 530-1 can be formed such that it does not extend laterally, e.g., left-to-right in FIG. 5A, to one or more edges of the select gate 508 material. For example, the photo resist 530-1 can be formed to be smaller in at least one dimension than the select gate 508 material so as to leave a portion of the select gate 508 material exposed at the left and right edges.

The top view shown in FIG. 5A shows that the photo resist 530-1 can be formed over the select gate 508 material so as to extend to or past an edge(s) of select gate 508 material at which a stair step structure in the stack is not to be formed, such as at the upper and lower edges of the select gate 508 material shown in FIG. 5A. The photo resist 530-1 can extend to or past the upper and lower edges of the select gate 508 material, as shown in FIG. 5A. According to one or more embodiments, photo resist 530-1 can be formed to extend past the edges of the select gate 508 material by a distance equal to the total distance by which the photo resist is subsequently reduced for all material removal processes. With such an overlap, proportional reduction of the photo resist in each of the two dimensions shown in FIG. 5A will result in the smallest photo resist still extending to the edges of select gate 508 material at which a stair step structure in the stack is not to be formed.

FIG. 5B shows the configuration of the stack after a first material removal process, e.g., an etch. Some material of the stack not protected by photo resist 530-1 is removed. The first material removal process is controlled so as to remove material of the stack to the depth of insulating material 507-4. That is, portions of select gate 508 material, as well as underlying insulating material and access line material not protected by photo resist 530-1 has been removed.

Figure 5C:
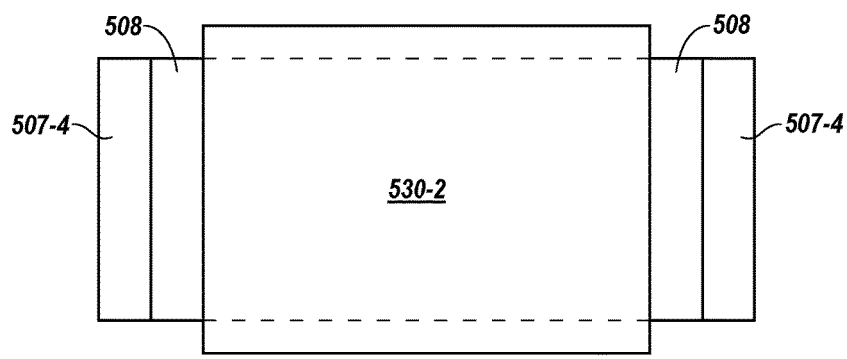

FIG. 5C shows a photo resist 530-2 being re-sized from that of photo resist 530-1 shown in FIGS. 5A and 5B so as to expose another portion of select gate 508 material at the top of the stack of materials. The insulating material 507-4, exposed by the first material removal process, also remains exposed. Re-sizing of the photo resist 530-2 is shown being of reduced size in not only the lateral dimension, e.g., left-right, but also reduced by a proportional amount in a perpendicular dimension, e.g., top-bottom. The photo resist can be re-sized in all dimensions during a dry etch of the polysilicon and oxide, for instance.

Therefore, while forming stair steps in one direction, e.g., the horizontal direction in FIG. 5C, the width of the photo resist, e.g., in the vertical direction shown in FIG. 5C, can be maintained so as not to be reduced in width so as to expose the conductive and/or insulating materials underneath at the upper or lower edges. Therefore the width of the photo resist can initially be formed to extend beyond an edge of the select gate 508 material. This can mandate the silicon area be larger in the vertical direction shown in FIG. 5C so that the photo resist can be formed thereover, which can consume a larger volume and footprint.

However, even with the reduction in size of the photo resist 530-2, the photo resist 530-2 still extends past the edges of the select gate 508 material at which stair step formation is not to occur, e.g., at the upper and lower edges of the select gate 508 material. This proportional over-extension of the photo resist beyond edges of the select gate 508 material at which stair step structure is not to be formed can be utilized where the photo resist is re-sized in place, such as by trimming or etch of the photo resist material.

Figure 5D:
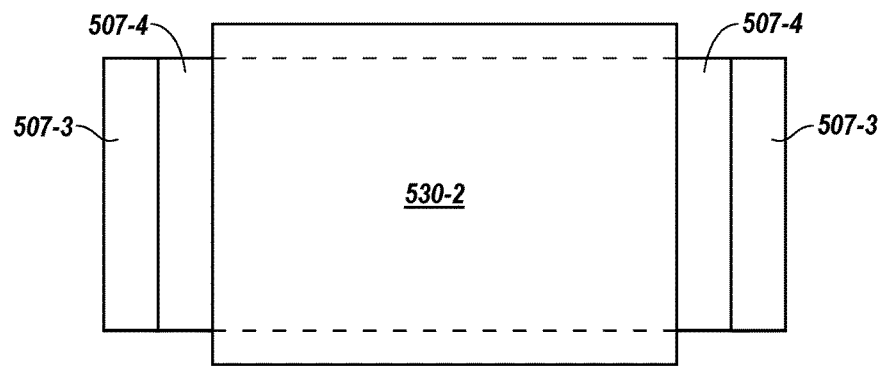

FIG. 5D shows the configuration of the stack after a second material removal process, e.g., a second etch. A depth of material of the stack not protected by photo resist 530-2 is removed, including another portion of exposed select gate 508 material, insulating material, and access line material not covered by photo resist 530-2 to expose insulating material 507-4. The second material removal process also simultaneously removes the insulating material 507-4 exposed by the first material removal process and access line material beneath the exposed insulating material 507-4 to expose insulating material 507-3 as a second stair step. Therefore, FIG. 5D shows a stair step structure with two steps resulting from the second removal process, corresponding to the side view shown in FIG. 4D.

Figure 5E:
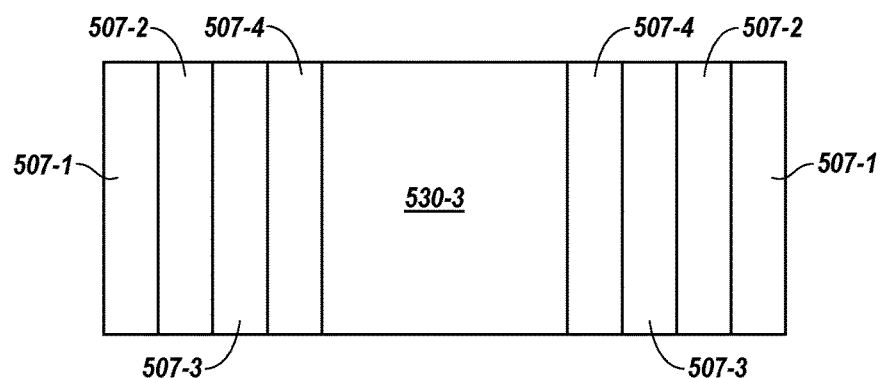

As described above, the material removal processes can be further repeated, each one utilizing a photo resist that is smaller by a stair step width on each respective location of stair step formation, e.g., each of left and right edges, and optionally, smaller by a similar amount in the perpendicular direction. FIG. 5E shows the configuration of the stack after four material removal processes to create additional steps, including four steps respectively having insulating layers 507-1, 507-2, 507-3, and 507-4 atop the respective steps.

Figure 5F:
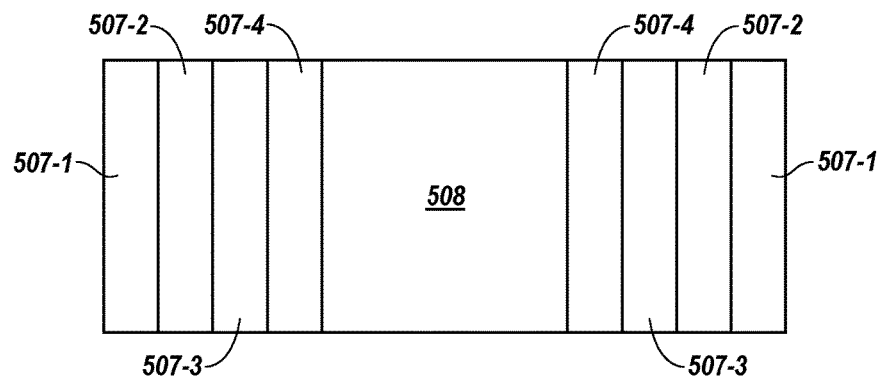

FIG. 5E corresponds to the side view of the stack shown in FIG. 4E, where photo resist 530-3 has been reduced by the width of several steps on each side with respect to photo resist 530-2. FIG. 5E shows that photo resist 530-3 has been similarly reduced to the upper and lower edges of insulating material 507-4 by the last re-sizing of the photo resist. FIG. 5F shows the configuration of stair step structure of the stack corresponding to FIG. 4F after the four material removal processes and after the photo resist 530-3 is removed, e.g., by CMP, leaving a final stair step structure with the select gate 508 material exposed.

Figure 6A:
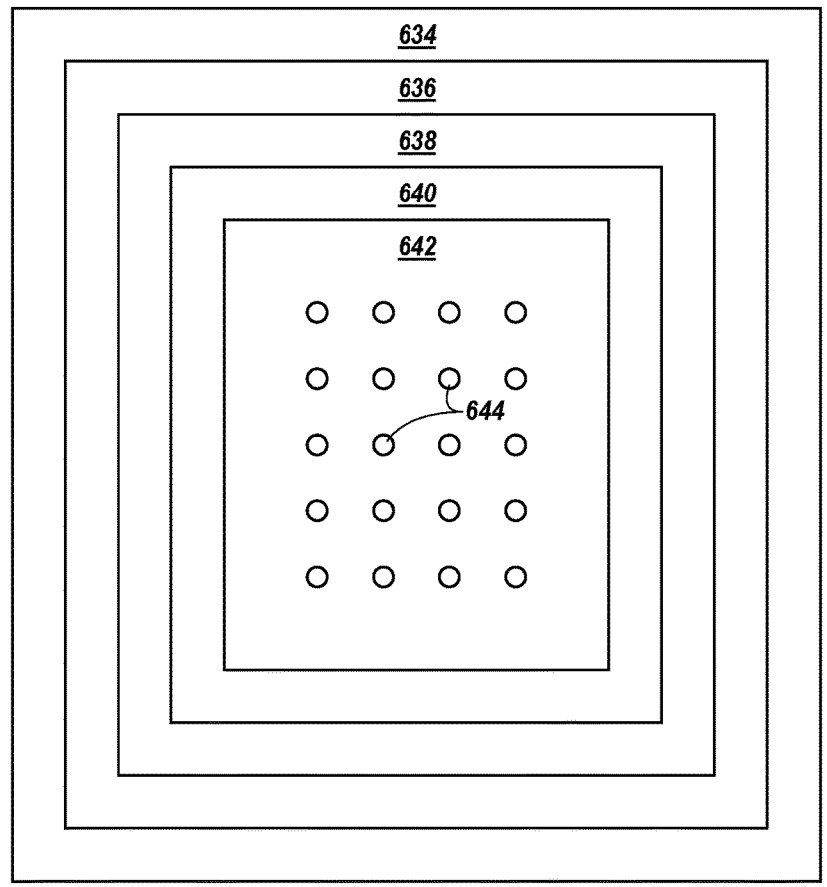
FIGS. 6A and 6B are prior art block diagrams illustrating stair step formation in four directions.
Figure 6B:
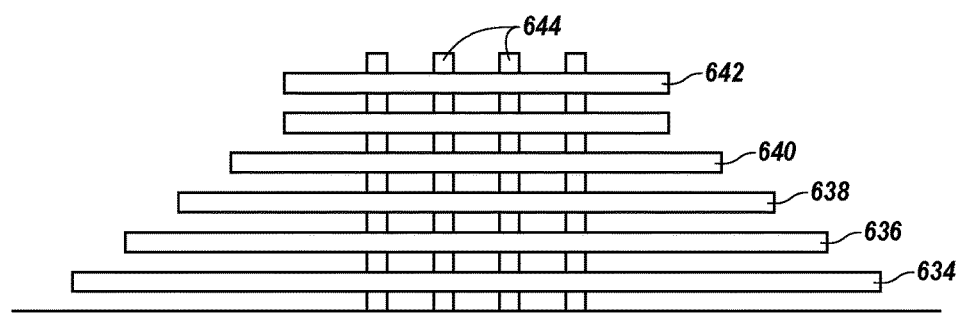

FIGS. 6A and 6B are prior art block diagrams illustrating stair step formation at four edges of stack materials. FIG. 6A shows a top view of a stack of materials configured into a stair step structure at each of four edges of the stack. FIG. 6A shows the stack having a plurality of stair steps, including a first (bottom) step 634 that extends beyond a second step 636, which extends beyond a third step 638, which extends beyond a fourth step 640, which extends beyond a fifth (top) step 642. Vias 644 can be formed into the stack, and memory cells can be formed therein (vias 644 are shown in outline in FIG. 6B since insulating materials are not shown).

The stair step structure shown in FIG. 6A can be formed in a similar manner to that described with respect to FIGS. 4A-4F using a photo resist that does not extend to (or beyond) any of the four edges, such that a stair step structure is formed at each edge. Although only five steps are shown in FIG. 6A, the quantity and sizing of the steps is not limited to those shown, and can include more or fewer steps of the same or different sizes.

FIG. 6B shows a side view of the conductive materials of the stack shown in FIG. 6A. Insulating materials of the stack, such as may be between the select gate materials and/or access line materials are omitted for clarity.

Figure 7A:
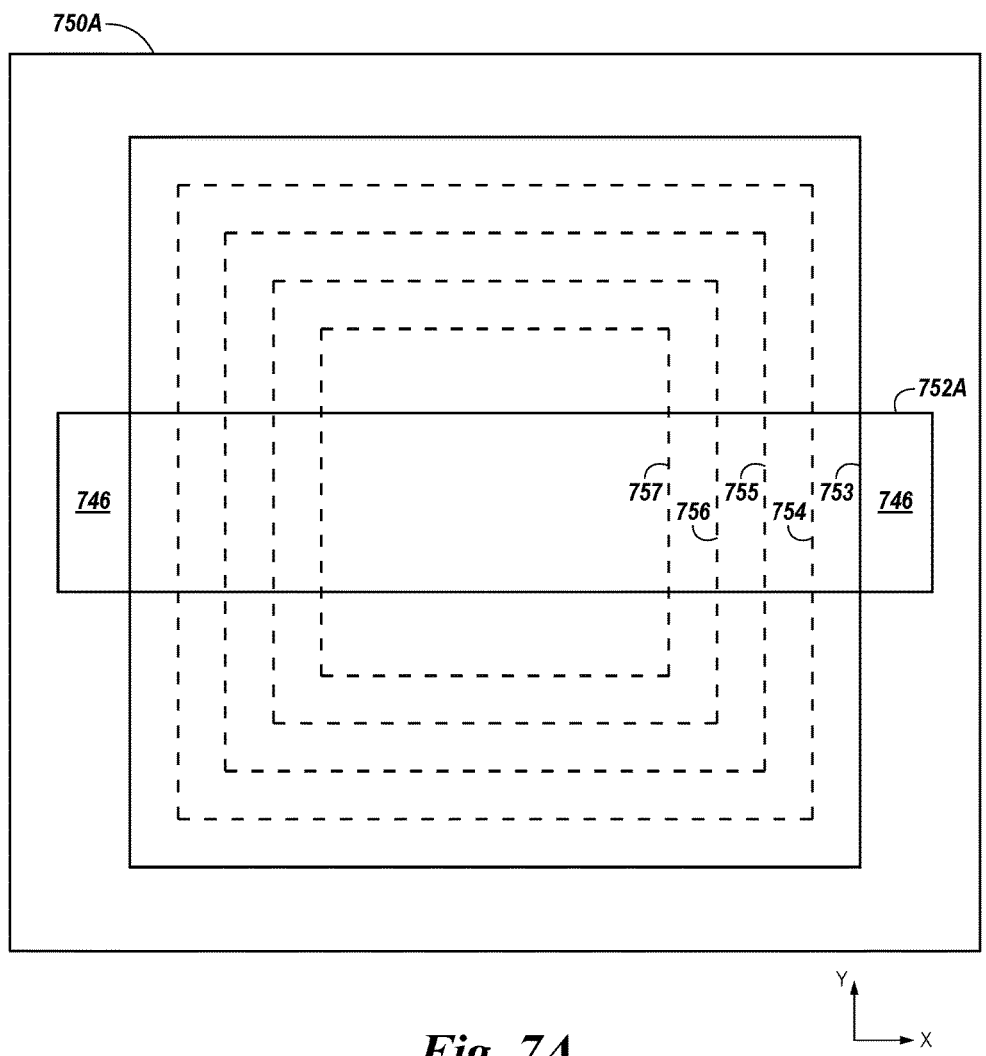
FIG. 7A is a block diagram illustrating stair step formation in two directions using two masks in accordance with one or more embodiments of the present disclosure.

FIG. 7A is a block diagram illustrating stair step formation at only a portion of each of two edges of a stack of materials using an area mask in accordance with one or more embodiments of the present disclosure. FIG. 7A shows an area mask 750A having an opening 752A, e.g., window, therethrough. The area mask can be a hard mask, for example, formed of silicon nitride, silicon oxide, silicon oxynitride, aluminum oxide, or the like. That is, a hard mask material can be formed over the stack of conductive and insulating materials and patterned and etched to form the opening 752A.

According to various embodiments, the area mask 750A is formed over the stack of conductive and insulating materials with the opening 752A therethrough so as to expose an area of the stacked materials, e.g., conductive material, in which a stair step structure is to be formed. In this manner, the area mask 750A can define a first exposed area of the stack of conductive materials, which is left exposed through opening 752A.

A photo resist mask can be formed over the opening 752A, extending to, or past, e.g., overlapping, the area mask 750A. According to some embodiments, the photo resist mask can formed of a material that has an etching rate greater than that of the area mask. According to various embodiments, the photo resist mask can be formed over a portion of the first exposed area of the conductive material. In this manner, the photo resist mask can define a second exposed area, the second exposed area being less than the first exposed area. For example, the second exposed area 746 is defined within opening 752A in part by photo resist mask 753.

According to various embodiments, the second exposed area is less than all of the first exposed area of the conductive material. For example, the photo resist mask can be formed first as shown at 753 for a first material removal process leaving areas 746 of the stack, e.g., conductive material, exposed and subject to material removal. Conductive material (and underlying insulating and/or conductive materials) in area 746 do not have portions of the area mask 750A or the photo resist mask, e.g., 753, formed thereover. As can be seen in FIG. 7A, an initial dimension, e.g., length (shown in FIG. 7A in the horizontal, or X, direction), of the photo resist mask 753 can be less than a corresponding dimension, e.g., length, of the first exposed area, as defined by opening 752A in area mask 750A.

An initial width, e.g., in the vertical Y-direction shown in FIG. 7A, of the photo resist mask 753 can be at least a width of the area mask plus a distance equal to the difference between the initial length of the photo resist mask and a final length of the photo resist mask after the stair step structure is formed. That is, the photo resist mask may be etched away and/or trimmed to a smaller size and used to subsequently form additional stair steps. The initial width of the photo resist mask can be at least the width of the area mask plus an overlap distance. The amount of initial overlap, e.g., overlap distance, can be, for example, equal to a difference in the length of the photo resist mask between the initial length of the photo resist mask and a final length of the photo resist mask after the stair step structure is formed.

The amount of initial overlap can depend on how many stair steps comprise the stair step structure. According to some embodiments, the initial width of the photo resist mask can be at least the width of the area mask plus a product of a number of stair steps in the stair step structure times an amount by which the photo resist mask is resized to form one stair step. That is, if the photo resist mask is etched and/or trimmed all around a same distance between material removal to form respective stair steps, then in order to maintain some overlap, or at least abut an edge of the area mask for the last step formation so as not to allow unintended removal of material, the photo resist mask can be oversized with respect to the width of the area mask window by an amount per stair step times the quantity of stair steps.

According to a number of embodiments, the photo resist mask can initially overlap the portion of the area mask by an amount by which the photo resist mask is reduced to form a next stair step times a quantity of stair steps to be formed. For instance, a stair step structure involving two stair steps can be formed by two material removal processes, which typically only involves resizing the photo resist mask once. Therefore, the photo resist mask can initially overlap the area mask by the distance that the photo resist mask is reduced in size during one material removal process. A stair step structure involving three stair steps can be formed by using two photo resist mask resizings, e.g., 3−1=2. Therefore, the photo resist mask can initially overlap the area mask by the distance that the photo resist mask is reduced in size during two photo resist mask resizings.

As shown in FIG. 7A, a stair step structure can be formed involving an area 746 at the right side of opening 752A and an area 746 at the left side of opening 752A. The two exposed areas 746 are shown being non-contiguous, with the photo resist mask 753 formed between areas 746. The area mask 750A can be formed to configure the opening 752A to be a non-square rectangle, as shown in FIG. 7A. However, embodiments of the present disclosure are not so limited, and area 746 can be of various sizes, shapes, and/or locations. That is, according to some embodiments, the area mask 750A can be formed to configure the opening 752A to be other geometric shapes, such as square, circular, a polygon with three or more sides, etc. The initially-formed photo resist mask 753 can be formed completely across the opening 752A in at least one dimension, for example, across the smaller dimension, e.g., in the Y-direction from top to bottom of opening 752A as shown in FIG. 7A. The initially-formed photo resist mask 753 can be formed to overlap the area mask 750A by at least an amount by which the photo resist mask is reduced in forming a stair step times the quantity of stair steps to be formed. That is, the initially-formed photo resist mask 753 can be formed to overlap the area mask at the top and bottom edges of opening 752A shown in FIG. 7A by an amount equal to the distance between position 757 and 753.

Figure 7B:
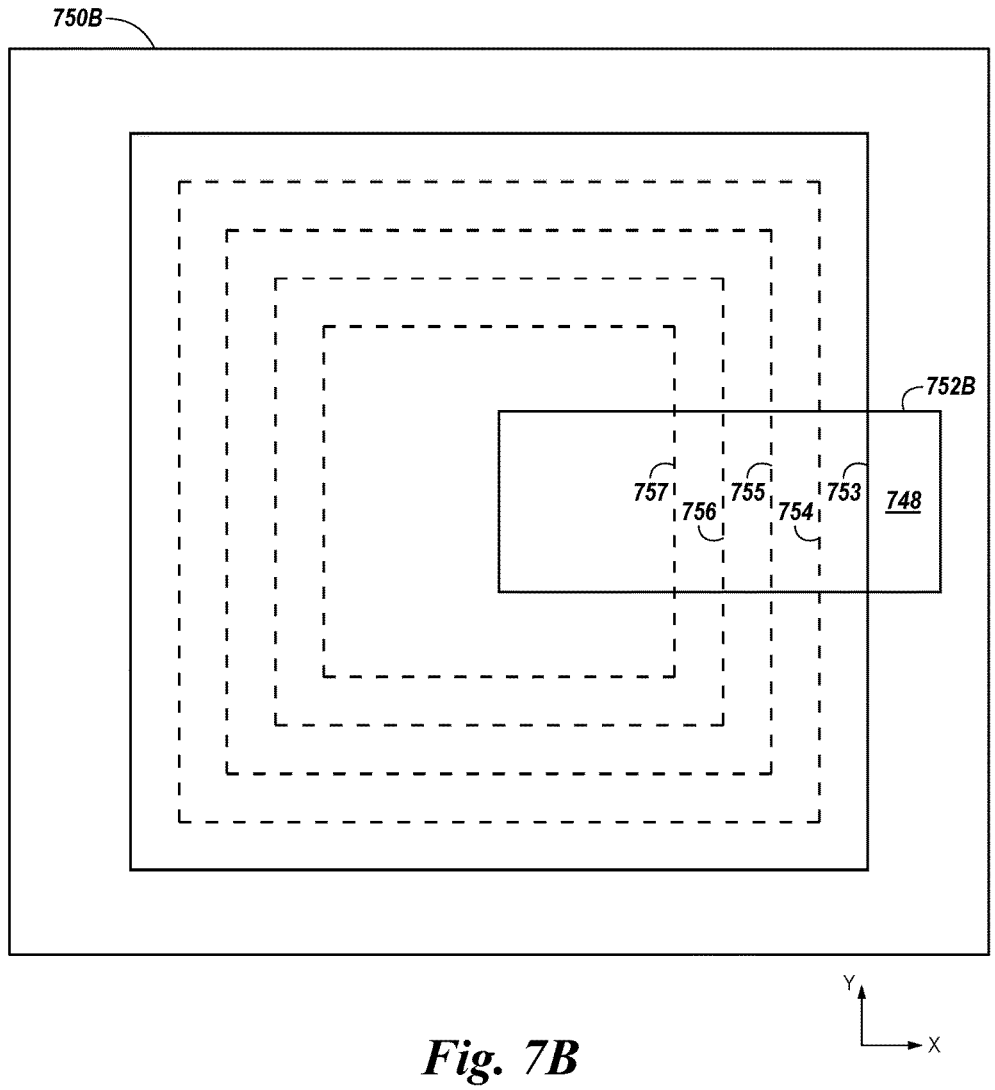
FIG. 7B is a block diagram illustrating stair step formation in one direction using two masks in accordance with one or more embodiments of the present disclosure.

Subsequently, the initially-formed photo resist mask 753 can be re-sized, e.g. formed, to a smaller size and located at the position shown at dotted outline 754 for a second material removal process, re-sized to a smaller size and located at the position shown at dotted outline 755 for a third material removal process, re-sized to a smaller size and located at the position shown at dotted outline 756 for a fourth material removal process, and re-sized to a smaller size and located at the position shown at dotted outline 757 for a fifth material removal process. Only one of photo resist masks 753, 754, 755, 756, or 757 is formed over the opening 752A at a time. The photo resist masks 753, 754, 755, 756, or 757 can be centered over the opening 752A, i.e., centered in one direction over the opening 752A such that the two exposed areas 746 are of equal area, as shown in FIG. 7A, or offset from center, as shown in FIG. 7B. The area mask 750A can remain in place, as shown, for all material removal processes. In this manner, a stair step structure can be formed within opening 752A, for example, at each side of opening 752A.

The area mask 750A with opening 752A limits a stair step structure to be formed at only certain portions of a stack of materials, such as at one edge, two edges, or at only a portion of each of one or two edges, as is described with respect to FIG. 8A-8L. That is, area mask 750A with opening 752A can limit formation of the stair step structure to be at less than all, e.g., four, edges of the stack of materials. The opening 752A can be oriented to form one or more stair step structures in the X-direction, as shown in FIG. 7A, in a Y-direction, or in some other, e.g., intermediate, direction. Use of the area mask 750A with opening 752A for stair step structure formation can result in narrow width stair step structures, which allow other signal lines and features to be formed in areas masked by the area mask 750A and/or photo resist mask. The restricted opening 752A, and resulting smaller stair step structure, can result in a smaller overall die size since the area mask can be used to protect areas where stair step formation is not needed.

FIG. 7B is a block diagram illustrating stair step formation in one direction using an area mask in accordance with one or more embodiments of the present disclosure. FIG. 7B shows an area mask 750B having an opening 752B, e.g., window, therethrough formed over the stack of conductive and insulating materials. A photo resist mask can be formed over the opening 752B as shown at 753, and extending to or past the area mask 750B. According to various embodiments, the photo resist mask can be formed over a portion of the area of the conductive material exposed through opening 752B so as to leave area 748 of the stack, e.g., conductive material, exposed and subject to material removal. Conductive material (and underlying insulating and/or conductive materials) in area 748 do not have a portion of the area mask 750B or the photo resist mask, e.g., 753, formed thereover.

As shown in FIG. 7B, a stair step structure can be formed involving area 748 at the right side of opening 752B. The photo resist mask can be formed over the area mask 750B with respect to three of four edges of the opening 752B, e.g., shaped as a non-square rectangle. The photo resist mask, e.g., 753, is formed such that it covers all of the exposed area of the conductive material in opening 752B other than one area 748. A first material removal process can be applied to area 748.

Subsequently, the photo resist mask can be re-sized, e.g., formed, as shown at 754 for a second material removal process, re-sized as shown at 755 for a third material removal process, re-sized as shown at 756 for a fourth material removal process, and re-sized as shown at 757 for a fifth material removal process. The area mask 750B can remain in place, as shown, for all material removal processes. In this manner, a stair step structure can be formed within opening 752B, for example, at the right side of opening 752B.

Figure 8A:
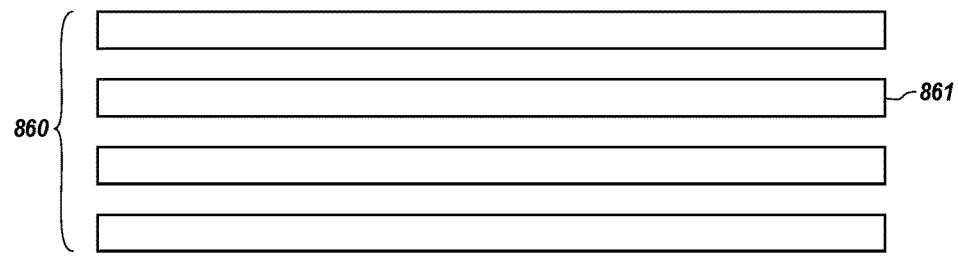
FIGS. 8A-8L are block diagrams illustrating stair step formation in one direction using two masks in accordance with one or more embodiments of the present disclosure.

FIGS. 8A-8L are block diagrams illustrating stair step formation using an area mask in accordance with one or more embodiments of the present disclosure. FIG. 8A shows an end view of a stack 860 of conductive materials 861. The conductive materials 861 constitute respective stair steps in the stack 860. The stack 860 can also include insulating materials between the conductive materials 861, which are omitted from FIGS. 8A-8L for clarity. The quantity, composition and order of conductive materials to which the method of the present disclosure can be applied can be the same or different than that shown in this example. For example, the stack 860 can include a plurality of select gate conductive materials, a plurality of access line conductive materials, and/or other conductive and/or insulating materials.

Figure 8B:
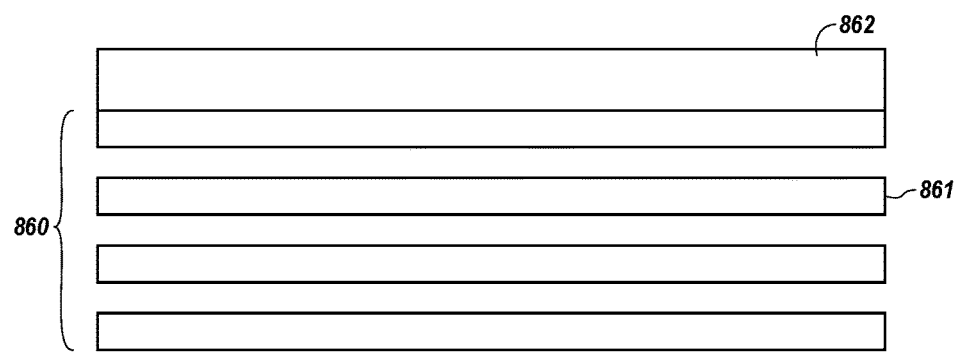
Figure 8C:
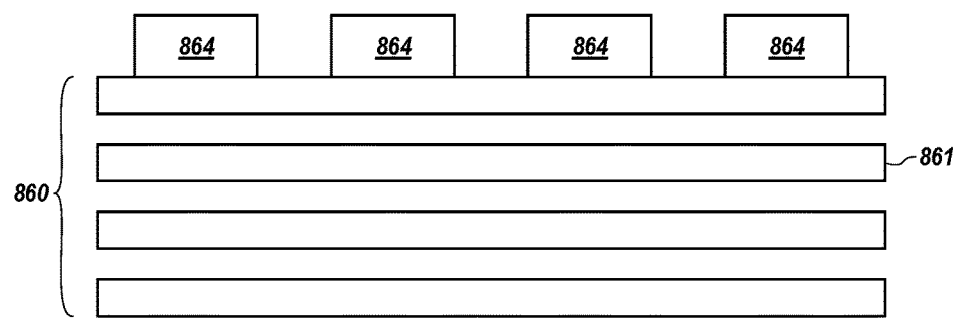
Figure 8D:
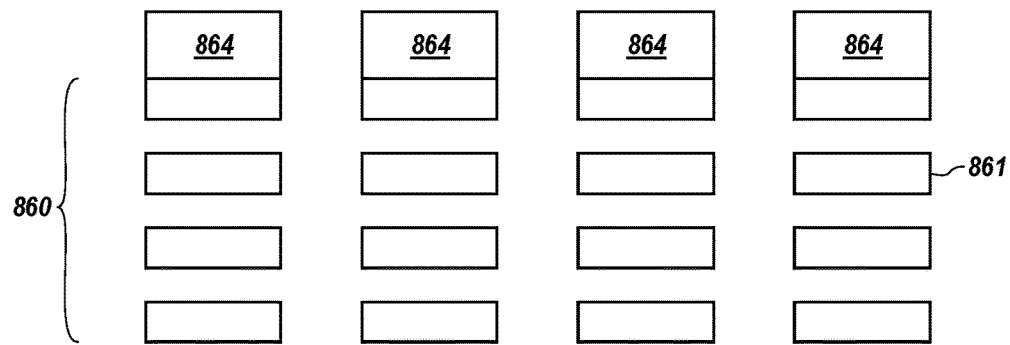
Figure 8E:
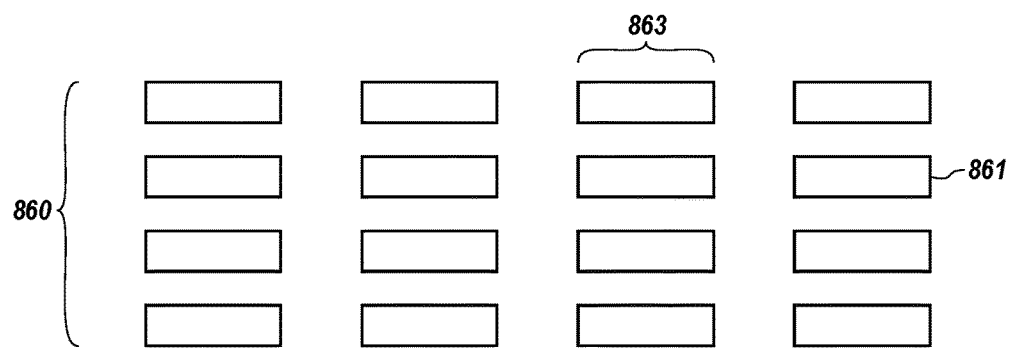

FIG. 8B shows a chop mask material 862, e.g., a hard mask material, formed over stack 860. FIG. 8C shows the chop mask material 862 after patterning and etching into area masks 864. FIG. 8D shows the stack 860 after further processing to etch the conductive materials 861 (and insulating materials—not shown) into a number of stack columns 863 based on the patterning of the area masks 864. FIG. 8E shows the etched stack 860 of FIG. 8D after further processing to remove the area masks 864, such as by CMP, for example. Although not shown, materials such as insulating materials, can be deposited into the spaces formed by etching the conductive materials 861 (and insulating materials—not shown) based on the patterning of the area masks 864.

Figure 8F:
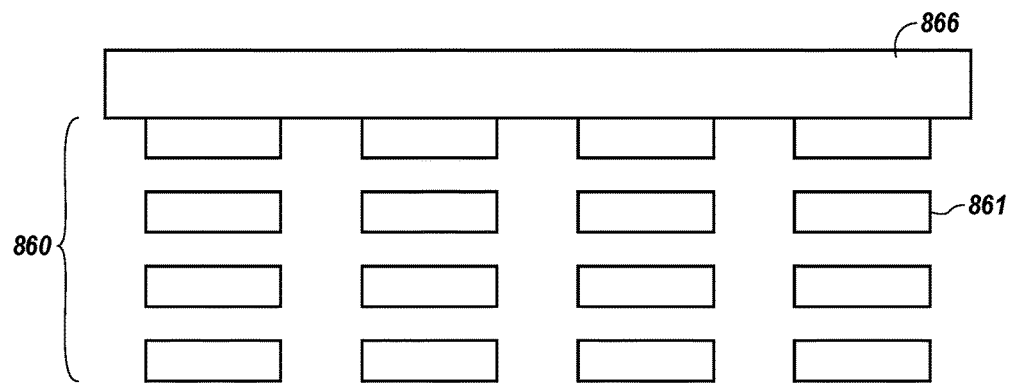
Figure 8G:
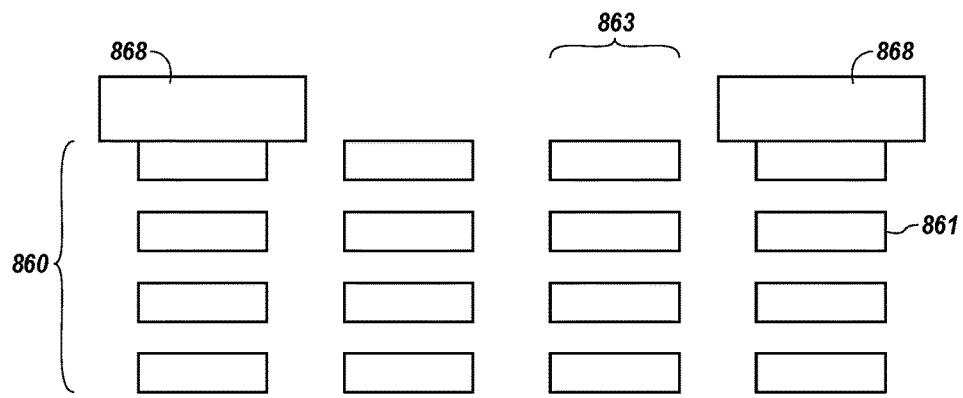
Figure 8H:
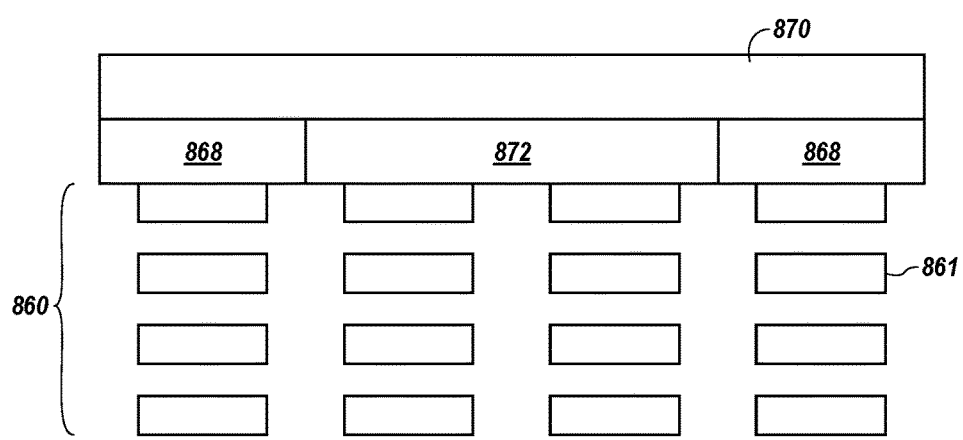

FIG. 8F shows a hard mask material 866 formed over the patterned and etched stack 860. FIG. 8G shows the hard mask material 866 after patterning and etching into area mask 868. As shown in FIG. 8G, area mask 868 can extend laterally beyond the edges of some of the stack columns 863 of conductive material 861. FIG. 8H shows a first 872 and second 870 photo resist mask formed over the patterned and etched stack 860 and/or area mask 868. The first photo resist mask 872 is shown in FIG. 8H disposed between portions of area mask 868, and second photo resist mask 870 is shown formed over the first photo resist mask 872 and area masks 868. Although discrete first 872 and second 870 photo resist masks are shown in FIG. 8H, the photo resist masks can be formed by a single photo resist mask material formation, e.g., deposition.

Figure 8I:
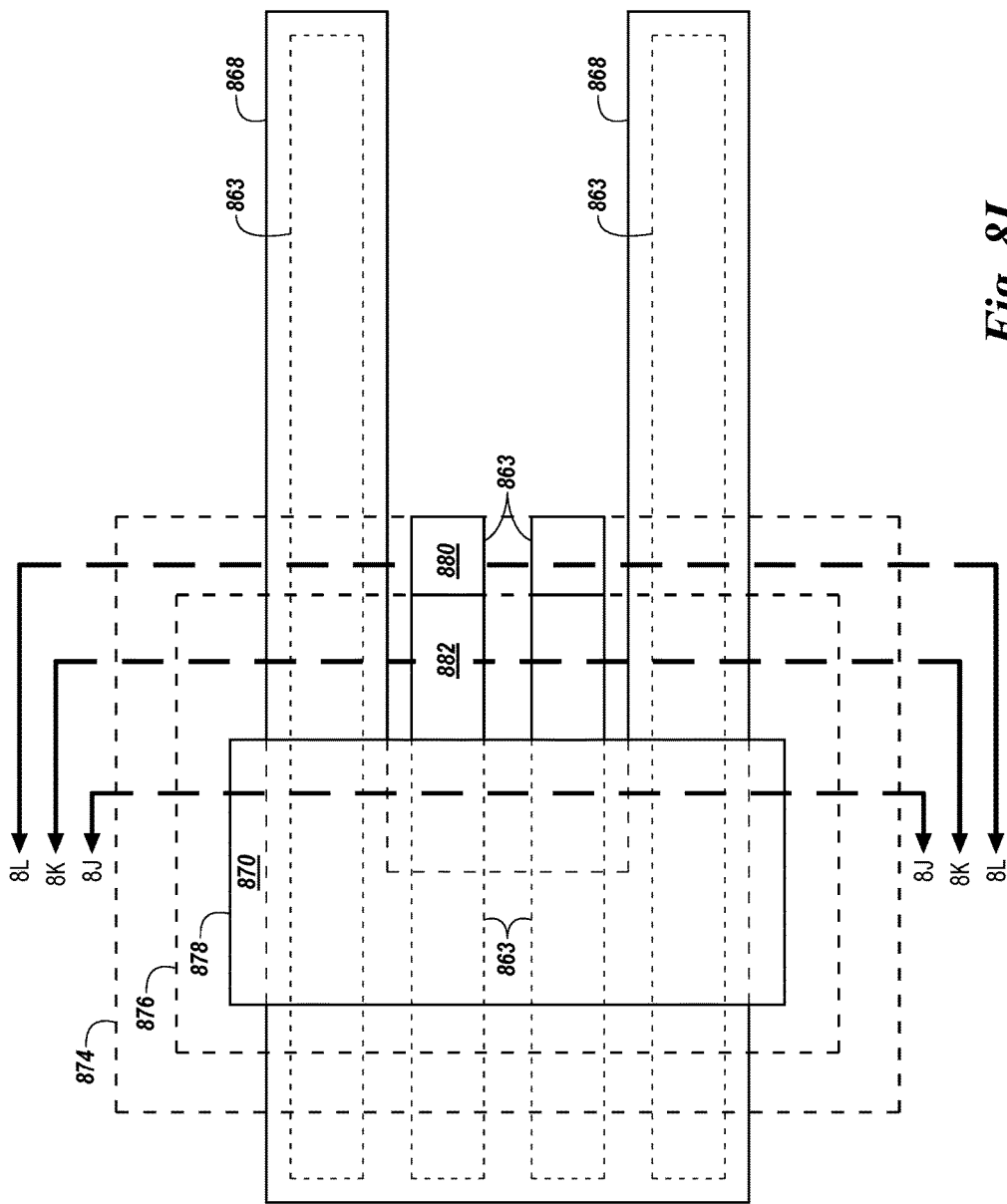

FIG. 8I shows a top view of the stack 860 (FIG. 8H) after further processing. Cut lines 8J, 8K, and 8L are indicated on FIG. 8I, corresponding to the end views shown in FIGS. 8J, 8K, and 8L respectively. FIG. 8I shows the area mask 868, e.g., hard mask, after the forming, patterning and etching described with respect to the previous figures. Area mask 868 has an opening therethrough that configures the area mask to resemble a U-shaped polygon that covers entirely the outermost stack columns 863 and partially covers the inner stack columns 863.

A number of photo resist mask configurations can be used in conjunction with the area mask 868 to form a stair step structure involving the inner stack columns 863, in the location shown in FIG. 8I. For example, photo resist mask configuration 874, 876, and 878 can be used to pattern a stair step structure out of the inner stack columns 863, e.g., the portions of the inner stack columns 863 not removed by first, second, and third material removal processes, as described previously with respect to previous figures. FIG. 8I shows at least one of the inner stack of columns 863 having a first end, e.g., left end, located in-line with and adjacent to first ends, e.g., left ends, of the two outer stacks of columns, and at least one inner stack of columns has a second end, e.g., right end, located not in line with second ends, e.g., right ends, of the two outer stack of columns such that the stair step structure is formed at the second end, e.g., right end, of the at least one inner stack of columns.

Figure 8J:
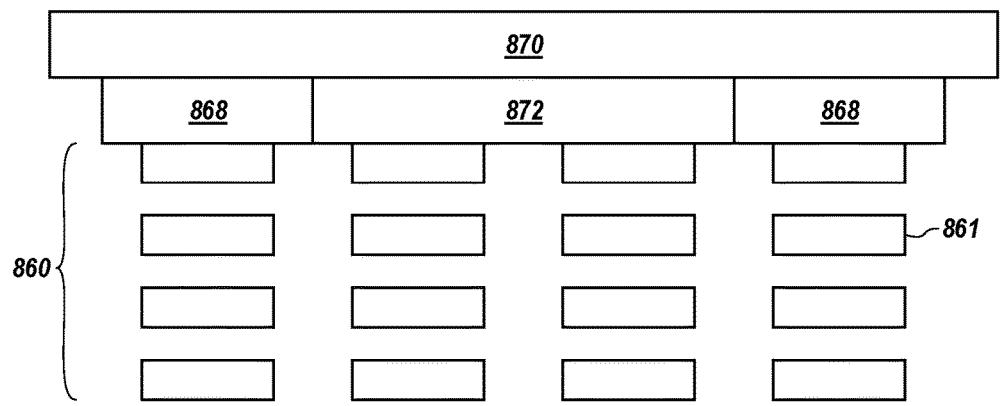

FIG. 8J is an end view of the stack 860 taken at cut line 8J shown in FIG. 8I. FIG. 8J reflects the photo resist mask 870 in the third 878 photo resist mask configuration, and shows the top conductive materials 861 in each of the outer and inner stack columns 863 with the top conductive material remaining as the top step of the stair step structure since this portion of the outer and inner stack columns 863 is always covered by either the area mask 868 or the photo resist mask 870/872 for all configurations, e.g., 874, 876, 878 of the photo resist mask 870/872 used in forming the stair step structure.

Figure 8K:
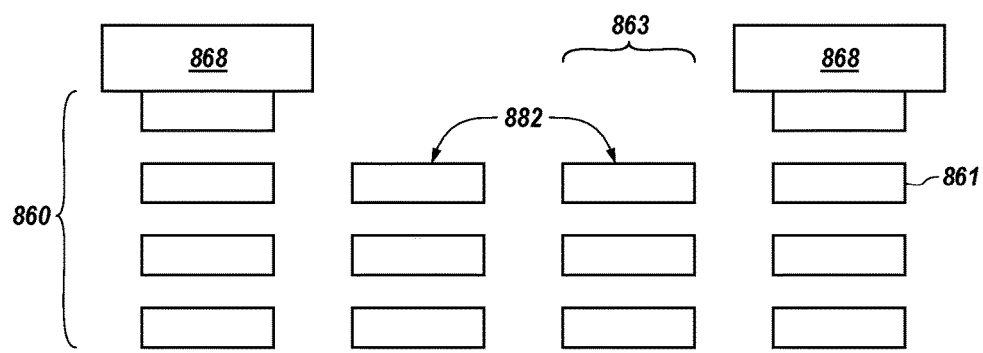

FIG. 8K is an end view of the stack 860 taken at cut line 8K shown in FIG. 8I. FIG. 8K also reflects the photo resist mask 870 in the third 878 photo resist mask configuration. However, cut line 8K does not intersect photo resist mask 870, which is therefore not shown in FIG. 8K. FIG. 8K shows the conductive materials in each of the outer stack columns 863 being always covered by the area mask 868 for all material removal processes used to form the stair step structure.

FIG. 8K shows the top tier of conductive materials 861 in each of the inner stack columns 863 removed since the inner stack columns 863 at the location of cut line 8K are covered by the photo resist mask 870/872 for material removal processes involving the first 874 and second 876 photo resist mask configuration, but is not covered for a material removal process involving the third 878 photo resist configuration. At the location of cut line 8K, the inner stack columns 863 form a middle step in the stair step structure with the second tier 882 of conductive materials exposed.

Figure 8L:
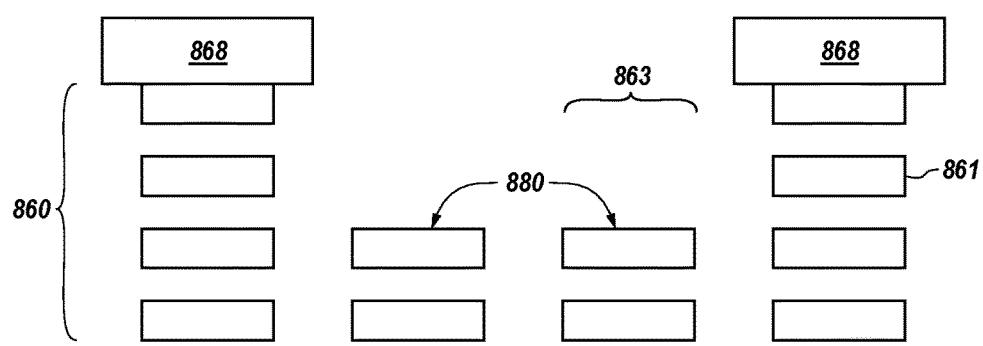

FIG. 8L shows the top two stair steps of conductive materials 861 in each of the inner stack columns 863 removed since the inner stack columns 863 at the location of cut line 8L are covered by the photo resist mask 870/872 for material removal processes involving the first 874 photo resist mask configuration, but is not covered for material removal processes involving the second 876 and third 878 photo resist configurations. At the location of cut line 8L, the inner stack columns 863 form a bottom step in the stair step structure with the third tier 880 of conductive materials exposed.

As can be observed in FIG. 8I, the use of the area mask in conjunction with a photo resist mask can confine stair step formation to smaller areas and/or to areas closer to other features than can be achieved, for example, if stair steps are formed around all sides of a photo resist mask used alone, e.g., without an area mask. For instance, stair steps can be formed on only the inner stack columns 863 as shown in FIG. 8I, where an area mask 868 is used to define, in whole or in part, the area within which the stair steps are to be formed using the photo resist mask. In this manner, stair steps can be used in forming coupling from smaller and/or more precisely-located areas adjacent a memory array to driver circuitry, for example.

The first material removal can include shortening a length of the at least one inner stack of columns to be less than a length of the two outer stacks of columns. Further material removal processes, e.g., etches, can be used to form the stair step structure at the shortened end of the at least one inner stack of columns, e.g., the end not aligned with the outer stacks of columns. Although not shown in FIG. 8I, a stair step structure can also be formed in the shortened end of the at least one inner stack of columns, e.g., the end not aligned with the outer stacks of columns. A stair step structure can also be formed at one or more edges of the outer stacks of columns. That is, an area mask used in conjunction with a photo resist mask can be used to form stair step structures in a variety of non-uniform shapes and sizes. The initial size of the photo resist mask can be sized to overlap the area mask by at least an amount by which it will be removed during etching and/or trimmed during formation of all, e.g., a plurality, of stair steps.

As will be appreciated from the foregoing illustrations and descriptions, an area mask can be used to define areas of the stack at which stair step structures are not to be formed. A photo resist mask can thereafter be used in different footprint configurations, e.g., shrinking, in areas not protected by the area mask to form one or more stair step structures. The area mask can have an opening therethrough such that the area mask is configured to cover some portion of a stack of conductive and/or insulating materials that is not to be etched in any material removal process used to form a stair step structure, and not cover another portion of the stack of conductive and/or insulating materials that is to be etched in a material removal process used to form a stair step structure. In this manner, stair step formation can be confined to only those areas in which stair steps are needed in a final configuration of the stack of conductive and/or insulating materials (as opposed to stair step structures being formed and subsequently removed).

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the appended claims reflect, inventive subject matter lies in less than all features of a single disclosed embodiment. Thus, the appended claims are hereby incorporated into the Detailed Description, with each claim standing on its own as a separate embodiment.

What is claimed is:

1. A method, comprising:
    forming a first mask over a conductive material to define a first exposed area;
    forming a second mask over a portion of the first exposed area to define a second exposed area, the second exposed area smaller than the first exposed area;
    forming a plurality of conductive lines comprising a stack of alternating conductive materials and insulating materials; and
    forming a plurality of strings of memory cells coupled to respective conductive lines of the plurality of conductive lines, wherein the stack of alternating conductive materials and insulating materials have a stair step structure formed at an edge of the stack.

2. The method of claim 1, wherein forming the plurality of strings of memory cells comprises forming a plurality of non-linear strings of memory cells.

3. The method of claim 2, wherein forming the plurality of non-linear strings of memory cells comprises forming a plurality of U-shaped strings of memory cells.

4. The method of claim 1, wherein forming the plurality of strings of memory cells comprises forming a plurality of linear strings of memory cells.

5. The method of claim 4, wherein forming the plurality of linear strings of memory cells comprises forming the plurality of linear memory cells such that they are arranged substantially orthogonal to the plurality of conductive lines.

6. The method of claim 1, wherein the second mask is formed of a material that has an etching rate greater than that of the first mask.

* * * * *